US006448848B1

(12) United States Patent
Altmann

(10) Patent No.: US 6,448,848 B1
(45) Date of Patent: Sep. 10, 2002

(54) METHOD OF CONTROLLING COMMON-MODE IN DIFFERENTIAL GM-C CIRCUITS

(75) Inventor: Michael W. Altmann, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,435

(22) Filed: Dec. 29, 2000

(51) Int. Cl.[7] .................................................. G06G 7/12
(52) U.S. Cl. ...................................................... 327/563
(58) Field of Search ................................ 327/551, 552, 327/553, 555, 556, 557, 558, 559, 560, 561, 562, 563; 330/258

(56) References Cited

U.S. PATENT DOCUMENTS

| 3,959,733 | A | * | 5/1976 | Solomon et al. ............ 330/253 |
| 5,254,956 | A | * | 10/1993 | Nishijima ................... 330/258 |
| 5,959,492 | A | * | 9/1999 | Khoury et al. ................ 326/68 |
| 5,963,084 | A | * | 10/1999 | Eschauzier .................. 327/552 |
| 6,104,232 | A | * | 8/2000 | Filip .......................... 326/126 |
| 6,111,467 | A | | 8/2000 | Luo ............................ 330/305 |
| 6,335,655 | B1 | * | 1/2002 | Yamamoto ................... 327/103 |

OTHER PUBLICATIONS

Integrated Continuous–Time Filters: Principles, Design and Applications; edited by Y.P. Tsividis and J.O. Voorman; A Selected Reprint Volume, 1993; IEEE Press; the Institute of Electrical and Electronics Engineers, Inc., New York, NY; pp. 258–269, 270–278, 279–284.

* cited by examiner

Primary Examiner—Jeffrey Zweizig
(74) Attorney, Agent, or Firm—Blakely, Sokoloff, Taylor & Zafman LLP

(57) ABSTRACT

An apparatus and method is disclosed wherein a first gm-C cell has an output, a second gm-C cell has an input coupled to the output of the first gm-C cell, and a feedback loop is coupled between the first and the second gm-C cell to control a CM voltage with respect to a reference.

19 Claims, 5 Drawing Sheets

METHOD OF CONTROLLING COMMON-MODE IN DIFFERENTIAL GM-C CIRCUITS

FIELD OF THE INVENTION

This patent application describes a method of controlling common-mode (CM) voltage range in differential transconductor-capacitor (gm-C) circuits. It can also be applied equally as well to more generalized VCO, filter and amplifier circuits.

BACKGROUND OF THE INVENTION

Differential gm-C circuits offer good design trade-offs for speed and power for high frequency circuitry. Filters using transconductors and capacitors are often called "gm-C" filters. A transconductor is a circuit that has a voltage as an input and a current as an output. Most of the integrated gm-C filters use transconductance tuning vis a PLL, or transconductance fixing with an external precision resistor. However, differential gm-C circuits typically suffer from limited linear range, and the requirement for a common-mode control circuit. This need arises in both state-space and bi-quad structures, because of their dependence on integrator building blocks. The goal for a good integrator design is to maximize output impedance for high DC gain, and to minimize degradation of complex pole 'Q' factors. The high impedance outputs are loaded with differential or grounded capacitive loads. Differential filter structures, such as state-space or ladder structures, include differential feedback to control the differential signal excursions, however there is no implicit control of the common-mode (CM) voltage of amplifier outputs.

This is usually accomplished by sensing the CM level through a pair of differential amplifiers between the output and a CM reference, but large swing non-linearity can cause differential to common-mode conversion and added distortion. Lower distortion circuits can be created using resistors to sense the CM level, but these have the disadvantage of increasing output conductance, reducing 'Q' factors for bi-quad structures.

CM control circuits also must have settling time constants widely separated from the actual filter poles, either much higher or much lower. This is to prevent the differential signal flow and the common-mode signal paths from interacting.

Typical gm-C type integrators and some CM control methods can be found in Y. Tsividis & J. O. Voorman (editors), *Integrated Continuous-Time Filters: Principles, Design, and Applications,* EEE Press, Copyright 1993.

BRIEF DESCRIPTION OF THE DRAWINGS

The present invention is illustrated by way of example and not limitation in the figures of the accompanying drawings, in which.

DETAILED DESCRIPTION OF THE PREFERRED EMBODIMENT

A filter structure apparatus and method wherein the CM voltage of the output of a first gm-C cell is controlled through a feedback loop from a subsequent gm-C cell is disclosed. An optional CM sensing amplifier may be included in this feedback loop between the first and the subsequent gm-C cell for sourcing a CM reference. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, circuits, processes and interfaces have not been shown or described in detail in order not to unnecessarily obscure the present invention.

Figure 1:
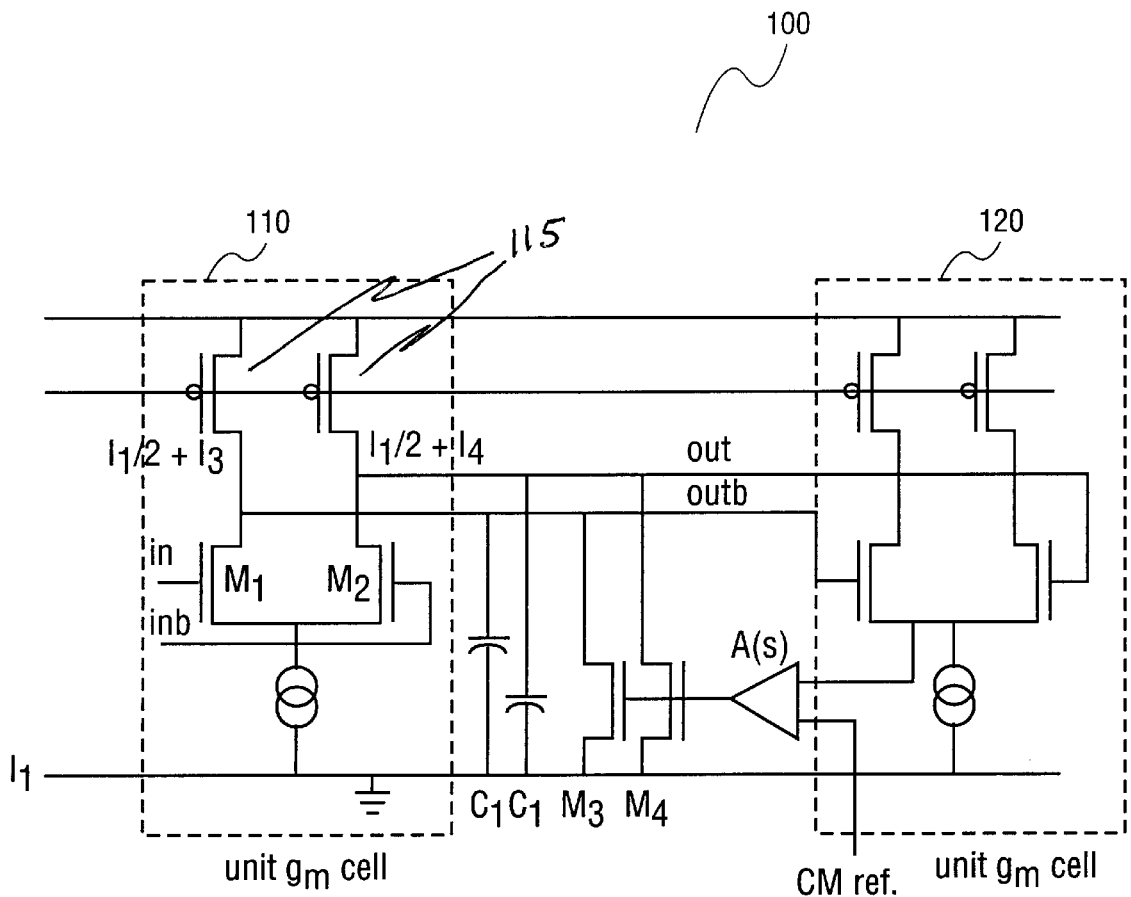
FIG. 1 illustrates the schematic diagram of the CM control circuit with simple gm-C circuits and a feedback loop with an amplifier.

Referring to FIG. 1, the filter structure and CM control circuit 100 of the present invention can be applied to simple differential gm stages such as differential amplifiers, or any other structure of differential gm-cells with an identifiable differential ground referenced by the input CM voltage. In FIG. 1, two unit gm cells 110 and 120 are shown coupled in a typical configuration. In this typical structure, each gm cell is comprised of two differential pairs of transistors, a PMOS pair and an NMOS pair. In cell 110, the NMOS differential pair is identified as M1 and M2. It will be apparent to those of ordinary skill in the art that modifications of the basic gm cell structure are possible while still benefiting from the advantages of the present invention as will be described in more detail below. An input to the filter structure shown in FIG. 1 is identified as (in) to transistor M1 and (inb—also denoted in-bar or in-not) to transistor M2. As a result of the conventional properties and operation of the unit gm cell 110 upon receiving input (in) and (inb), outputs (out) and (outb—also denoted out-bar or out-not) are produced. These outputs are fed as inputs to the NMOS differential transistor pair of the next unit gm cell in the series, unit gm cell 120, in the example shown in FIG. 1. Clearly, this structure can be replicated for any number of unit gm cells in a desired series. As also shown in FIG. 1, the outputs (out) and (outb) of unit gm cell 110 are separately tied to a current source line through capacitors C1. The current through the current source line to which these capacitors C1 are tied is identified as I1.

Figure 2:
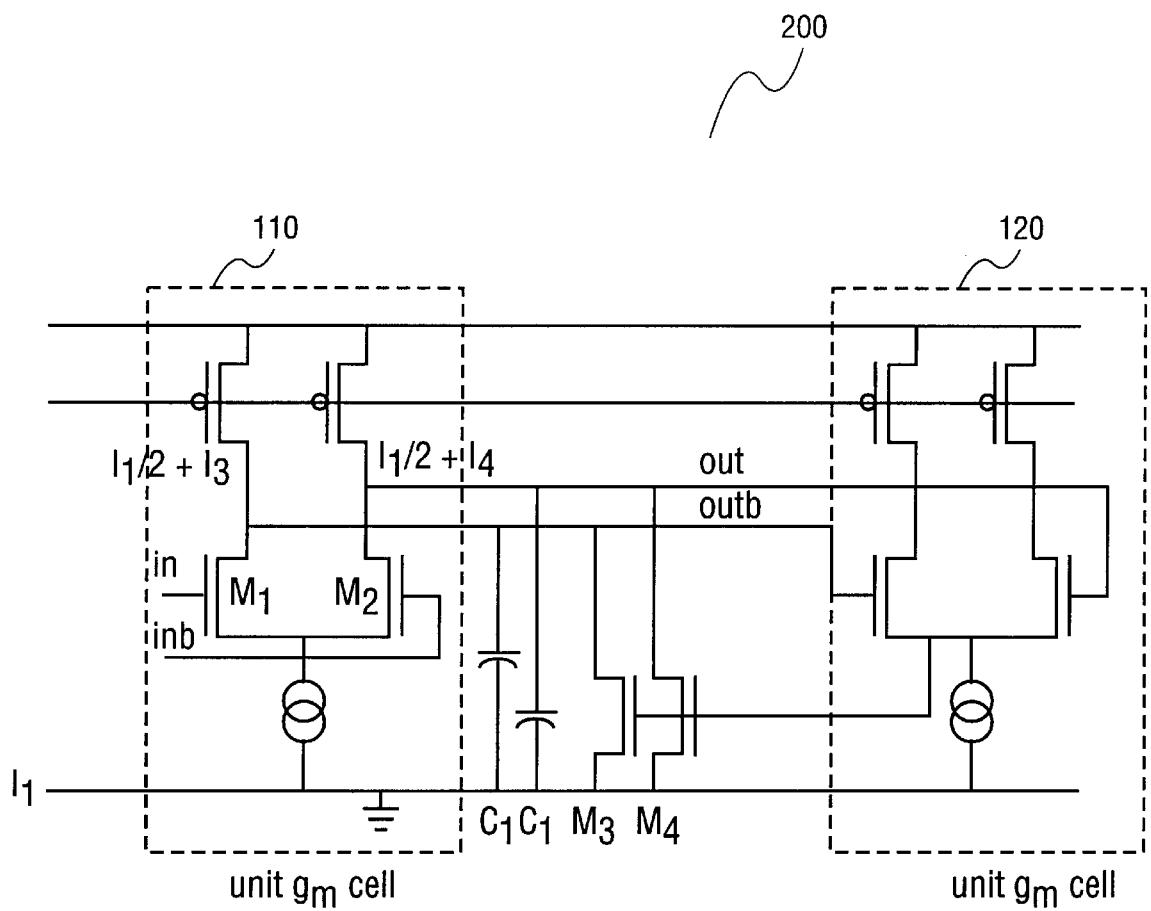
FIG. 2 illustrates the schematic diagram of the CM control circuit with simple gm-C circuits and a feedback loop without an amplifier.

Because the common mode (CM) output impedance of the NMOS differential pair (M1 and M2) is high, it is difficult to establish a good common mode reference on the output of a unit gm cell. For this reason, the present invention employs a feedback loop as shown in FIGS. 1 and 2. FIG. 1 illustrates an embodiment including an amplifier A(s) in the feedback loop. FIG. 2 illustrates an alternative embodiment without an amplifier in the feedback loop.

Referring to FIG. 1, the feedback loop of the present invention is coupled between the output of a first unit gm cell and the input of a second or subsequent unit gm cell in a series. This point in the circuit is shown as (out and outb) in FIGS. 1 and 2. As shown, (outb) is coupled to the current source line through transistor M3 and (out) is coupled to the current source line through transistor M4. Transistors M3 and M4 are controlled with an output of the second unit gm cell 120 through an amplifier A(s) as shown in FIG. 1. A common mode reference CM ref. is also provided as an input to the amplifier A(s). FIG. 2 illustrates this coupling of M3 and M4 to the output of unit gm cell 120 without the amplifier A(s). Note that transistors M3 and M4 can be very small (i.e. weak) transistors. In the preferred embodiment, only a small fraction, I3 and I4, of the total current in the current source line is traveling through nodes M3 and M4, respectively. As shown in FIGS. 1 and 2, the current through line (out) is given by the equation: ((I1/2)+I4) and the current through line (outb) is given by the equation: ((I1/2)+I3). Thus, the feedback loop will settle if the nodes M3 and M4 sink the excess current level that the PMOS devices are sourcing.

In the system illustrated in FIGS. 1 and 2, an integrator is formed with the differential pair 110 and load capacitors C1 on the left side of FIGS. 1 and 2 with a differential mode (DM) transfer function as set forth below.

$$\frac{V_{out}}{V_{in}} = \frac{V(out) - V(outb)}{V(in) - V(inb)} = \frac{(g_{m(1,2)}/g_0)}{1 + s(C_1/g_0)} \approx \frac{g_m(1,2)}{sC_1} = \frac{1}{(s/\omega_{DM})}$$

Where the differential unity gain bandwidth is given by:

$$\omega_{DM} = \frac{g_{m(1,2)}}{C_1}$$

The CM voltage of the output is controlled through the feedback loop on the right side of FIGS. 1 and 2. The CM sensing amplifier A(s) in this loop as shown in FIG. 1 is in the subsequent unit gm cell in the filter structure. This CM control loop has an open loop gain of:

$$H(s) = \frac{A(s) \cdot g_{m(3,4)}}{s \cdot C_1}$$

In unity feedback, this yields a CM loop response of:

$$A(s) = \frac{H(s)}{1 + H(s)} = \frac{1}{s\left(\frac{C_1}{A(s) \cdot g_{m(3,4)}}\right) + 1} = \frac{1}{\frac{s}{\omega_{CM}} + 1}$$

Where the loop bandwidth is given by:

$$\omega_{CM} = \frac{A(s) \cdot g_{m3}}{C_1}$$

Because both CM and differential loops are controlled by the same capacitor value, stability and time-constant separation is guaranteed if sufficiently different gm's are selected.

Simplifications here include ignoring the bandwidth effects from the parasitic pole due to the source followers in the CM loop (from the second/subsequent unit gm cell differential pair devices). This is a reasonable simplification, and one benefit of this invention.

In this invention, the CM control loop bandwidth is generally smaller than the main gm-C filter bandwidth, although this is not the only possibility within the scope of this invention. The CM and differential mode (DM) loops can also be stable if the CM control loop has significantly larger bandwidth (i.e. wCM>wDM).

In practice, the amplifier with gain 'A' can be substituted with a direct connection, as shown in FIG. 2, thereby reducing the CM control bandwidth expression to:

$$\omega_{CM} = \frac{g_{m3}}{C_1}$$

In this mode, the CM control voltage is given by the properties of the CM control NMOS devices (M3 and M4) as shown in FIGS. 1 and 2. The CM output voltage will be given by:

$$V_{CM} = V_{T3} + \sqrt{\frac{2I_{D3}}{k'_n} \cdot \frac{L_3}{W_3}}$$

A special case can occur when low-VT MOS devices are available, in which the output CM level is dominated by the (VGS-VT) bias point of M3 and M4. Assuming the bias currents are derived from the same sources, this can be designed to track the VD(SAT) of the bias current transistors 115 within the gm cells, providing an optimized CM level where the tail current sources are always operating just above the minimum VDS for saturated operation. This maximizes the available supply voltage for the active signals in the gm cells. This becomes increasingly important in low-voltage applications where these circuits must operate with less than 3V power supplies.

In our implementation, this causes no loop stability problems; because, the common source sensing node of the differential gm cells is an AC ground; thus, it does not affect the differential operation of the circuit. It is also typically a low-impedance node with very high CM bandwidth. This has the benefit of limiting the effect of parasitic poles in the CM control loop. The structure and operation of the present invention provides advantages including the effect that minimal additional current is required. The additional CM control currents (I3, I4) can be <10 % of the gm cell current. Further, the invention adds no resistive load to gm cells in gm-C filter structures. Also, the invention adds no further distortion to cause CM-differential feed-through.

The present invention provides a simple method of controlling the common mode (CM) output level voltage of a differential gm-C circuit that is inherently stable, and causes minimal interaction with the differential loop. The invention provides a method of using an internal differential AC ground node to sense the CM voltage of the output of a previous stage. The invented apparatus provides a method of sensing the CM voltage of the output of a gm cell, which adds no additional distortion to the original gm cell, and without adding significant extra circuitry or using significant additional power. The invented apparatus also provides a method for applying the CM sensing information to the output of a gm amplifier to control it's CM voltage in a manner that is inherently stable. The invented apparatus also provides a method of controlling the CM voltage in a differential filter structure in such a way as to maximize the signal headroom of a differential gm cell. The invented apparatus also provides a method of controlling the CM voltage, which results in an optimal bias point for current sources of differential gm cells. The invented apparatus also provides a method of controlling CM voltage in differential gm-C filter structures which can be generically extended to include any other integrator structure with an identifiable node which is both a CM ground, and a representation of CM voltage.

In a manner described in more detail below, the filter structure of the present invention also provides a CM control method that can be easily extended to fan-in and fan-out topologies of gm-C filters. The above description illustrates the simple case of a single gm cell driving another gm cell. In most filter structures, there are also fan-in and fan-out cases in which multiple gm cells can drive single gm inputs, or single gm cells can drive multiple gm cells respectively. In both of these cases, general connection rules can be applied which allow the circuit of the present invention to be advantageously used.

Figure 3:
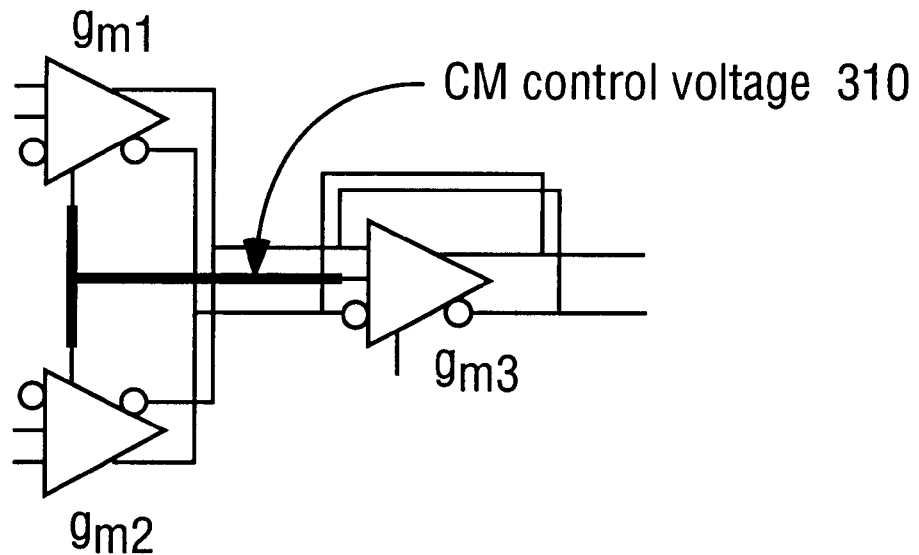
FIG. 3 illustrates the fan-in connection.

In the fan-in connection case illustrated in FIG. 3, multiple driving cells (gm1 & gm2) are connected to a single load cell (gm3). This connection is shown in FIG. 3. In general, the feedback signal 310 is extracted from the driven gm cells (gm3), and fed back to both of the driving gm cells (gm1 and gm2).

A special implementation can be made for a cell structure in which the CM control circuit elements, including the pull-down MOS M3 & M4 and the CM bias current source ICM, are in a separate circuit block and can be added only as needed. This will potentially reduce the matching of gm cell output capacitance.

Figure 4:
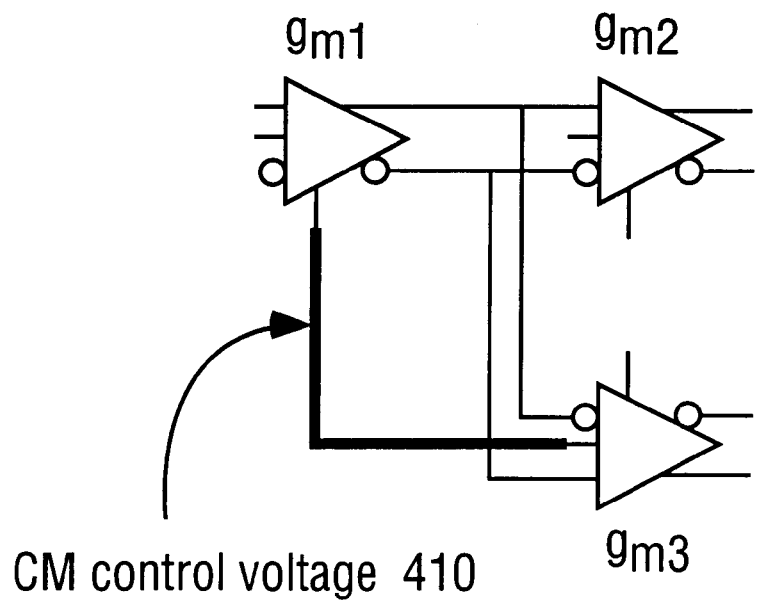
FIG. 4 illustrates the fan-out connection.

In the fan-out connection illustrated in FIG. 4, the feedback signal 410 can, in practice, only be taken from either one of the driven gm cells (gm2 or gm3) to prevent coupling of non-linear distortion between signal paths. The feedback is applied to the driving gm cell (gm1) in the same fashion as shown in FIGS. 1 and 2.

Figure 5:
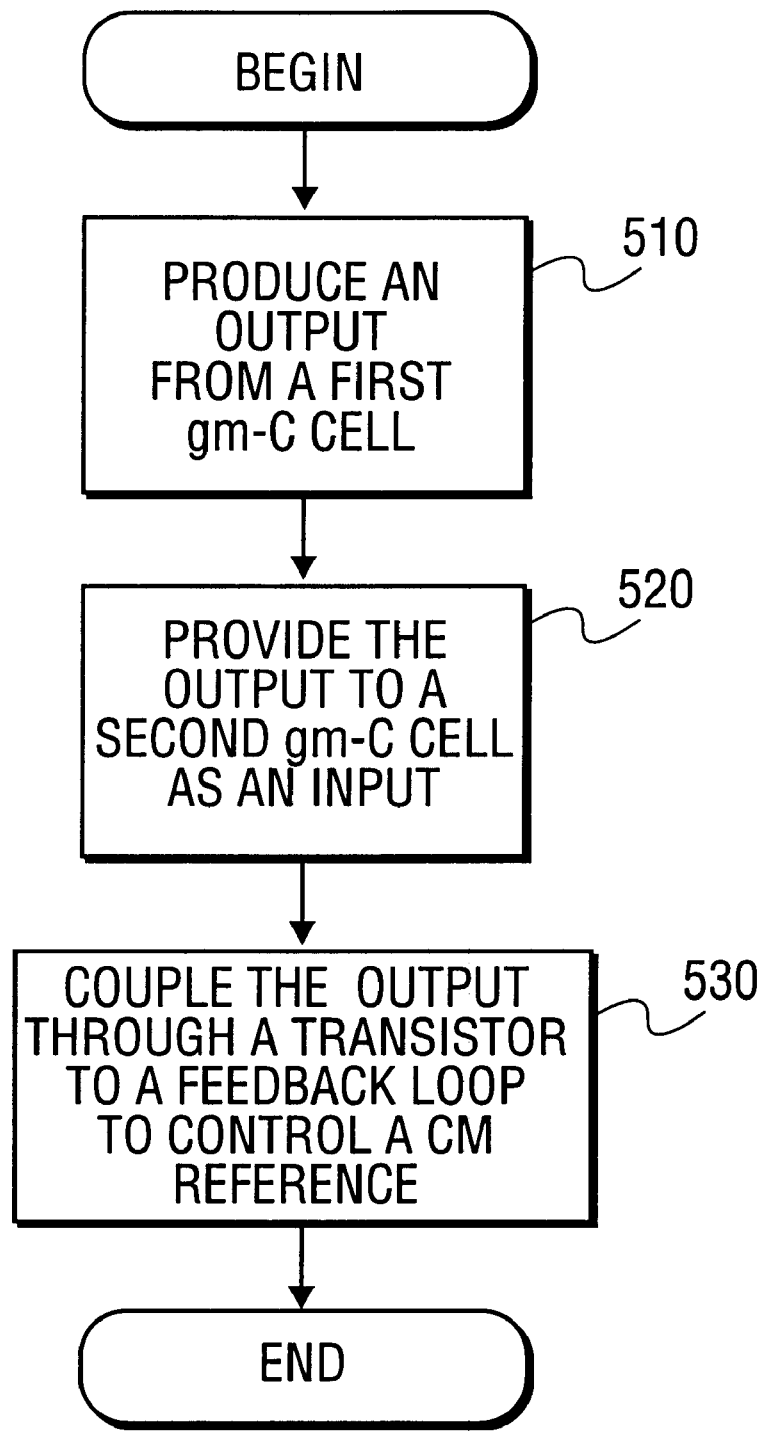
FIG. 5 illustrates the process of the present invention.

FIG. 5 illustrates the process of the present invention. Referring to FIG. 5, an output is produced by a first gm-C cell in block 510. This output is provided as an input to a second gm-C cell in block 520. Finally, a feedback loop is created by coupling the output of the first gm-C cell through a transistor controlled by an output of the second gm-C cell in block 530. Optionally, the transistor in the feedback loop can be controlled through an amplifier receiving a CM reference.

Figure 6:
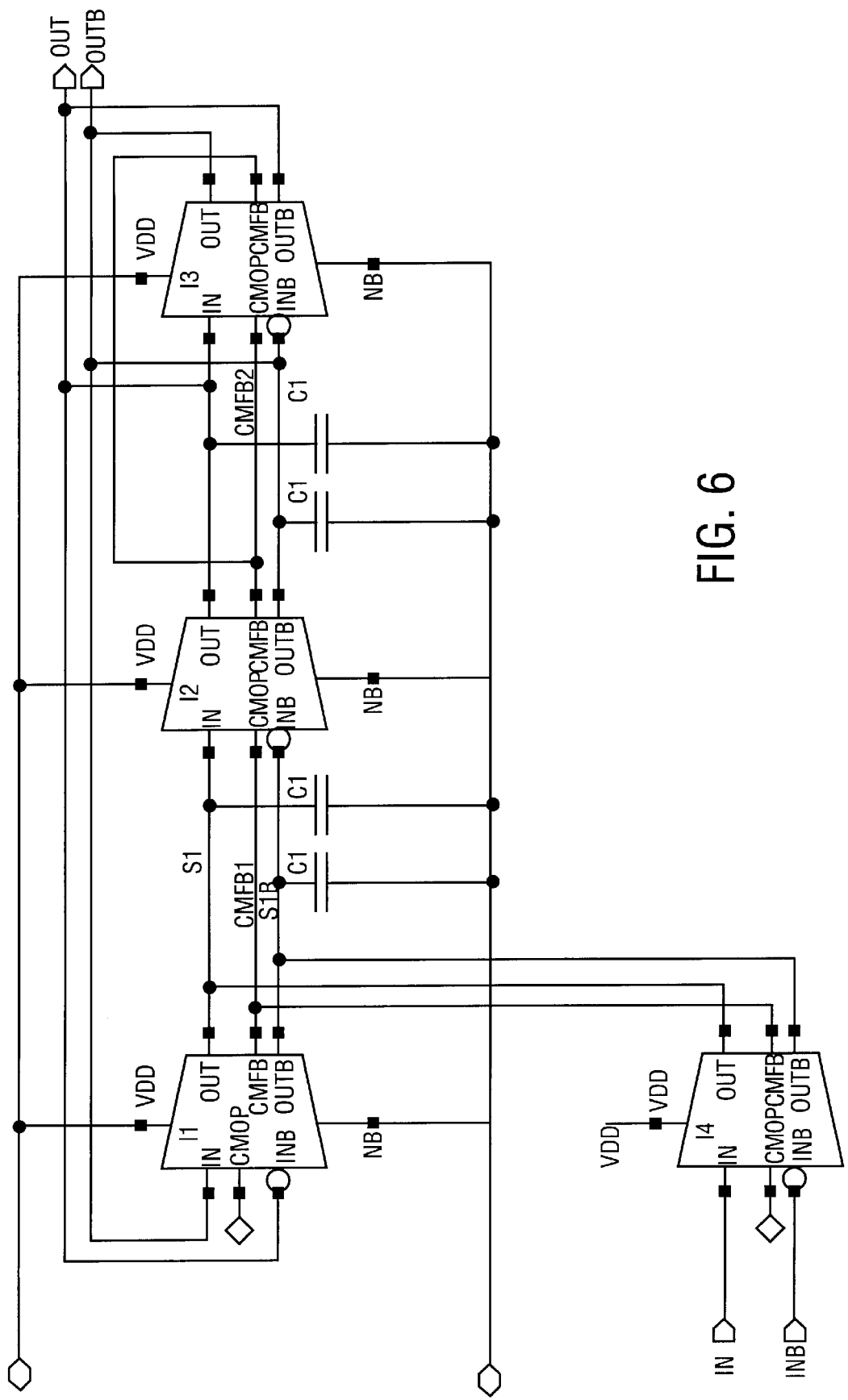
FIG. 6 illustrates an example of the present invention as used in a common gm-C based second order low-pass filter topology.

FIG. 6 illustrates an example of the present invention as used in a common gm-C based second order low-pass filter topology. In a manner similar to that shown in FIGS. 1 and 2, FIG. 6 shows a series of unit Gm cells, such as unit Gm cell I1, arranged in a filter topology. Transistors also shown in FIG. 6 are coupled to the outputs (out and outb) of Gm cell I1 in a configuration corresponding to load capacitors C1 shown in FIGS. 1 and 2. In an alternative embodiment, these transistors could be replaced by capacitors coupled in an equivalent configuration. The pull-down transistors M3 and M4 (not shown in FIG. 6) of the feedback loop of the present invention are coupled with their input tied to the unit Gm cell I1 pin labeled "cmfb". The unit Gm cell I2 pin labeled "cmop" in FIG. 6 is the tap from the common-source node to feed back the CM voltage. This sample low-pass filter topology achieves all of the advantages of the present invention as described above.

Thus, a novel filter structure apparatus and method is disclosed. Although the present invention is described herein with reference to a specific preferred embodiment, many modifications and variations therein will readily occur to those with ordinary skill in the art. Accordingly, all such variations and modifications are included within the intended scope of the present invention as defined by the following claims.

What is claimed is:

1. A filter structure apparatus comprising:
   a first gm-C cell having an output;
   a second gm-C cell having an input coupled to said output of said first gm-C cell and an output; and
   a feedback loop coupled between the output of the first gm-C cell and a transistor coupled to the output of the second gm-C cell to control a CM voltage with respect to a reference.

2. The apparatus as claimed in claim 1 wherein the feedback loop further includes an amplifier to source a CM reference.

3. The apparatus as claimed in claim 1 wherein the feedback loop further includes capacitor elements.

4. The apparatus as claimed in claim 1 wherein the strength of the transistor is substantially weaker than any transistor in the first gm-C cell.

5. An apparatus comprising:
   a means for providing a first gm-C cell output;
   a means for providing a second gm-C cell input coupled to said output of said first gm-C cell; and
   a means for providing a feedback loop coupled between the output of the first gm-C cell and a transistor coupled to an output of the second gm-C cell for controlling a CM reference.

6. The apparatus as claimed in claim 5 wherein the feedback loop further includes an amplifier means for sourcing a CM reference.

7. The apparatus as claimed in claim 5 wherein the feedback loop further includes a capacitor means.

8. The apparatus as claimed in claim, 5 wherein the strength of the transistor is substantially weaker than any transistor means in the first gm-C cell.

9. A process comprising:
   producing a first output from a first gm-C cell;
   providing the first output as an input to a second gm-C cell;
   producing a second output from the second gm-C cell; and
   coupling the second output through a transistor in a feedback loop to the first output to control a CM voltage with respect to a reference.

10. The process as claimed in claim 9 further including coupling the output through an amplifier with a CM reference input.

11. The process as claimed in claim 9 wherein the strength of the transistor in the feedback loop is substantially weaker than any other transistor in the first gm-C cell.

12. A filtering system comprising:
    a plurality of gm-C cells arranged in a filtering structure, a first gm-C cell of the plurality of gm-C cells having an output;
    a second gm-C cell of the plurality of gm-C cells having an input coupled to said output of said first gm-C cell and an output; and
    feedback loop coupled between the output of the first gm-C cell and a transistor coupled to the output of the second gm-C cell to control a CM voltage with respect to a reference.

13. The system as claimed in claim 12 wherein the feedback loop further includes an amplifier to source a CM reference.

14. The system as claimed in claim wherein the feedback loop further includes capacitor elements.

15. The system as claimed in claim 12 wherein the strength of the transistor is substantially weaker than any transistor in the first gm-C cell.

16. An apparatus comprising:
    a first cell having an output;
    a second cell having an input coupled to said output of said first cell and an output; and
    a feedback loop coupled between the first and the second cell to control a CM voltage with respect to a reference.
    a feedback loop coupled between the output of the first cell and a transistor coupled to the output of the second cell to control a CM voltage with respect to a reference.

17. The apparatus as claimed in claim 16 wherein the feedback loop further includes an amplifier to source a CM reference.

18. The apparatus as claimed in claim 16 wherein the feedback loop further includes capacitor elements.

19. The apparatus as claimed in claim 16 wherein the strength of the transistor substantially weaker than any transistor in the first cell.

* * * * *

UNITED STATES PATENT AND TRADEMARK OFFICE
CERTIFICATE OF CORRECTION

PATENT NO. : 6,448,848 B1
DATED : September 10, 2002
INVENTOR(S) : Altmann

It is certified that error appears in the above-identified patent and that said Letters Patent is hereby corrected as shown below:

Column 1,
Line 50, delete "EEE", insert -- IEEE --.

Column 3,
Line 2, delete "14", insert -- I4 --.

Column 5,
Line 46, delete "11", insert -- I1 --.

Signed and Sealed this

Seventh Day of September, 2004

JON W. DUDAS
*Director of the United States Patent and Trademark Office*